(12) United States Patent
Lyalin

(10) Patent No.: US 9,912,299 B2
(45) Date of Patent: *Mar. 6, 2018

(54) ARCHITECTURES AND DEVICES RELATED TO DOHERTY AMPLIFIERS

(71) Applicant: SKYWORKS SOLUTIONS, INC., Woburn, MA (US)

(72) Inventor: Aleksey A. Lyalin, Moorpark, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/289,917

(22) Filed: Oct. 10, 2016

(65) Prior Publication Data

US 2017/0026002 A1    Jan. 26, 2017

Related U.S. Application Data

(63) Continuation of application No. 14/797,261, filed on Jul. 13, 2015, now Pat. No. 9,467,115.

(51) Int. Cl.
*H04B 1/04* (2006.01)
*H03F 1/02* (2006.01)
(Continued)

(52) U.S. Cl.
CPC ............ *H03F 1/0288* (2013.01); *H01Q 1/48* (2013.01); *H01Q 7/00* (2013.01); *H03F 1/565* (2013.01);
(Continued)

(58) Field of Classification Search
CPC .......... H03F 7/42; H03F 1/0288; H03F 1/565; H03F 3/195; H03F 3/211; H03F 3/245; H04B 1/0475

(Continued)

(56) References Cited

U.S. PATENT DOCUMENTS 6,320,462 B1    11/2001  Alley
7,773,959 B1 *   8/2010  Bachhuber ........... H04B 1/0483
                                                    455/127.1
(Continued)

FOREIGN PATENT DOCUMENTS

KR    1020050031663 A    4/2005

OTHER PUBLICATIONS

International Search Report and Written Opinion for PCT/US2015/040098 dated Nov. 24, 2015.

*Primary Examiner* — Sanh Phu

(74) *Attorney, Agent, or Firm* — Chang & Hale LLP

(57) ABSTRACT

An amplifier architecture can include an input circuit for splitting a signal into first and second portions, and carrier and peaking amplification paths for receiving the first and second portions. The architecture can further include an output circuit having a balun transformer circuit with first and second coils, with the first coil between first and second ports, the second coil between third and fourth ports, the first and third ports coupled by a first capacitance, and the second and fourth ports coupled by a second capacitance. The first port can receive a first signal from the carrier amplification path, and the fourth port can receive a second signal from the peaking amplification path. The second port can provide a combination of the first signal and the second signal as an amplified signal. A termination circuit can be provided to couple the third port to a ground.

14 Claims, 12 Drawing Sheets

(51) Int. Cl.
*H03H 7/42* (2006.01)
*H03F 3/195* (2006.01)
*H03F 1/56* (2006.01)
*H03F 3/24* (2006.01)
*H03F 3/21* (2006.01)
*H01Q 1/48* (2006.01)
*H01Q 7/00* (2006.01)

(52) U.S. Cl.
CPC ............ *H03F 3/195* (2013.01); *H03F 3/211* (2013.01); *H03F 3/245* (2013.01); *H03H 7/42* (2013.01); *H03F 2200/09* (2013.01); *H03F 2200/111* (2013.01); *H03F 2200/198* (2013.01); *H03F 2200/411* (2013.01); *H03F 2200/451* (2013.01); *H03F 2203/21139* (2013.01); *H03F 2203/21142* (2013.01); *H04B 2001/0408* (2013.01)

(58) Field of Classification Search
USPC ...................................................... 455/114.2
See application file for complete search history.

(56) References Cited

U.S. PATENT DOCUMENTS

| | | | |
|---|---|---|---|
| 8,340,606 B2 | 12/2012 | Park | |
| 8,837,629 B2 | 9/2014 | Ghannouchi | |
| 8,928,404 B2 | 1/2015 | Khanifar | |
| 9,083,284 B2 | 7/2015 | Maslennikov | |
| 9,225,291 B2 | 12/2015 | Ahmed | |
| 9,467,115 B2 * | 10/2016 | Lyalin | H03H 7/42 |
| 2001/0030581 A1 | 10/2001 | Dent | |
| 2002/0102971 A1 | 8/2002 | Jayaraman | |
| 2002/0186079 A1 | 12/2002 | Kobayashi | |
| 2009/0045878 A1 | 2/2009 | Shiikuma | |
| 2011/0080215 A1 * | 4/2011 | Meng | H03F 1/0288 330/124 R |
| 2011/0158081 A1 | 6/2011 | Wang et al. | |
| 2011/0182319 A1 | 7/2011 | Hua | |
| 2012/0280755 A1 * | 11/2012 | Wright | H03F 1/565 330/307 |
| 2013/0027272 A1 | 1/2013 | Karthaus | |
| 2015/0002227 A1 | 1/2015 | Pribble | |
| 2016/0218682 A1 | 7/2016 | Lyalin et al. | |

* cited by examiner $$[S] = 1/\sqrt{2} \begin{bmatrix} 0 & -j & 1 & 0 \\ -j & 0 & 0 & 1 \\ 1 & 0 & 0 & -j \\ 0 & 1 & -j & 0 \end{bmatrix}$$

3db COUPLER HYBRID

FIG.9

$$[S] = 1/2 \begin{bmatrix} 0 & 1-j & 1+j & 0 \\ 1-j & 0 & 0 & 1+j \\ 1+j & 0 & 0 & 1-j \\ 0 & 1+j & 1-j & 0 \end{bmatrix}$$

3db BALUN HYBRID

ARCHITECTURES AND DEVICES RELATED TO DOHERTY AMPLIFIERS

CROSS-REFERENCE TO RELATED APPLICATION(S)

This application is a continuation of U.S. application Ser. No. 14/797,261 filed Jul. 13, 2015, entitled CIRCUITS, DEVICES AND METHODS RELATED TO COMBINERS FOR DOHERTY POWER AMPLIFIERS, which claims priority to and the benefit of the filing date of U.S. Provisional Application No. 61/992,843 filed May 13, 2014, entitled CIRCUITS, DEVICES AND METHODS RELATED TO COMBINERS FOR DOHERTY POWER AMPLIFIERS, the benefits of the filing dates of which are hereby claimed and the disclosures of which are hereby expressly incorporated by reference herein in their entirety.

BACKGROUND

Field

The present disclosure generally relates to radio-frequency (RF) signal combiners.

Description of the Related Art

Power combiners designed for Doherty power amplifiers (PAs) have typically been either bulky or narrowband. An example broadband Doherty combiner may be 14 millimeters by 2 millimeters or larger, making it undesirable for RFIC (radio-frequency integrated circuit), MMIC (monolithic microwave integrated circuit), or handset applications. Compact lumped implementations which are narrowband may be used in specific applications.

SUMMARY

In accordance with some implementations, the present disclosure relates to a signal combiner including a balun transformer circuit having a first coil and a second coil. The first coil is implemented between a first port and a second port. The second coil is implemented between a third port and a fourth port. The first port and the third port are coupled by a first capacitance. The second port and the fourth port are coupled by a second capacitance. The first port is configured to receive a first signal. The fourth port is configured to receive a second signal. The second port is configured to yield a combination of the first signal and the second signal. The signal combiner further includes a termination circuit that couples the third port to a ground.

In some embodiments, the first port can be configured to receive a carrier-amplified signal from a Doherty power amplifier (PA) and the fourth port can be configured to receive a peaking-amplified signal from the Doherty PA. In some embodiments, the termination circuit can include a capacitor. In some embodiments, the capacitor can have a capacitance approximately equal to a multiplicative inverse of two times pi times an operating frequency of the Doherty PA times a characteristic impedance of a load coupled to the Doherty PA.

In some embodiments, the first port can be configured to receive a peaking-amplified signal from a Doherty power amplifier (PA) and the fourth port is configured to receive a carrier-amplified signal from the Doherty PA. In some embodiments, the termination circuit can include an inductor. In some embodiments, the inductor can have an inductance approximately equal to a characteristic impedance of a load coupled to the Doherty PA divided by two time pi times an operating frequency of the Doherty PA.

In some embodiments, an S-parameter between a first one of the ports and a second one of the ports can be approximately equal to $(1+j)/2$. In some embodiments, an S-parameter between a first one of the ports and second one of the ports can be approximately equal to $(1-j)/2$. In some embodiments, an S-parameter matrix of S-parameters between the ports can only include values of approximately 0, $(1+j)/2$, and $(1-j)/2$.

In some embodiments, the balun transformer circuit can be implemented as an integrated passive device. In some embodiments, the integrated passive device further implements an auto-transformer based impedance matching circuit.

In some implementations, the present disclosure relates to a power amplifier module including a packaging substrate configured to receive a plurality of components and a signal combiner implemented on the packaging substrate. The signal combiner includes a balun transformer circuit having a first coil and a second coil. The first coil is implemented between a first port and a second port. The second coil is implemented between a third port and a fourth port. The first port and the third port are coupled by a first capacitance. The second port and the fourth port are coupled by a second capacitance. The first port is configured to receive a first signal. The fourth port is configured to receive a second signal. The second port is configured to yield a combination of the first signal and the second signal. The signal combiner further includes a termination circuit that couples the third port to a ground.

In some embodiments, the balun transformer circuit can be implemented as an integrated passive device. In some embodiments, the integrated passive device can further implement an auto-transformer based impedance matching circuit.

In some embodiments, the PA module can further include a Doherty PA implemented on the packaging substrate. The Doherty PA can have a carrier amplification path yielding a carrier-amplified signal and a peaking amplification path yielding a peaking-amplified signal. In some embodiments, the first port can be configured to receive the carrier-amplified signal and the fourth port can be configured to receive the peaking-amplified signal. In some embodiments, the termination circuit can include a capacitor having a capacitance approximately equal to a multiplicative inverse of two times pi times an operating frequency of the Doherty PA times a characteristic impedance of a load coupled to the Doherty PA. In some embodiments, the first port can be configured to receive the peaking-amplified signal and the fourth port can be configured to receive the carrier-amplified signal. In some embodiments, the termination circuit can include an inductor having an inductance approximately equal to a characteristic impedance of a load coupled to the Doherty PA divided by two time pi times an operating frequency of the Doherty PA.

In some embodiments, an S-parameter matrix of S-parameters between the ports only includes values of approximately 0, $(1+j)/2$, and $(1-j)/2$.

In some implementations, the present disclosure relates to a wireless device including a transceiver configured to generate a radio-frequency (RF) signal. The wireless device further includes a power amplifier (PA) module in communication with the transceiver. The PA module includes an input circuit configured to receive the RF signal and split the RF signal into a first portion and a second portion. The PA module further includes a Doherty PA having a carrier amplification path coupled to the input circuit to receive the first portion and a peaking amplification path coupled to the input circuit to receive the second portion. The PA module further includes an output circuit coupled to the Doherty amplifier circuit. The output circuit includes a balun transformer circuit having a first coil and a second coil. The first coil is implemented between a first port and a second port. The second coil is implemented between a third port and a fourth port. The first port and the third port are coupled by a first capacitance. The second port and the fourth port are coupled by a second capacitance. The first port is configured to receive a first signal via the carrier amplification path. The fourth port is configured to receive a second signal via the peaking amplification path. The second port is configured to yield a combination of the first signal and the second signal as an amplified RF signal. The wireless device further includes an antenna in communication with the PA module. The antenna is configured to facilitate transmission of the amplified RF signal.

In some implementations, the present disclosure relates to a method for amplifying a radio-frequency (RF) signal. The method includes providing a Doherty amplifier circuit having a carrier amplification path and a peaking amplification path, receiving an RF signal, splitting the RF signal into a first portion and a second portion, the first portion provided to the carrier amplification path, the second portion provided to the peaking amplification path, and combining, using a balun transformer circuit, an output of the carrier amplification path and an output of the peaking amplification path to yield an amplified RF signal. The balun transformer circuit includes a first coil and a second coil. The first coil is implemented between a first port and a second port. The second coil is implemented between a third port and a fourth port. The first port and the third port are coupled by a first capacitance. The second port and the fourth port are coupled by a second capacitance. The first port is configured to receive the output of the carrier amplification path. The fourth port is configured to receive the output of the peaking amplification path. The second port is configured to yield the amplified RF signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/797,254, entitled SYSTEMS AND METHODS RELATED TO LINEAR AND EFFICIENT BROADBAND POWER AMPLIFIERS, and U.S. patent application Ser. No. 14/797,275, entitled SYSTEMS AND METHODS RELATED TO LINEAR LOAD MODULATED POWER AMPLIFIERS, filed on even date herewith and hereby incorporated by reference herein in their entirety.

BRIEF DESCRIPTION OF THE DRAWINGS

FIG. 9 shows an example S-parameter matrix for the combiner of FIG. 5.

FIG. 10 shows an example S-parameter matrix for the combiner of FIG. 7.

DETAILED DESCRIPTION OF SOME EMBODIMENTS

The headings provided herein, if any, are for convenience only and do not necessarily affect the scope or meaning of the claimed invention.

Figure 1:
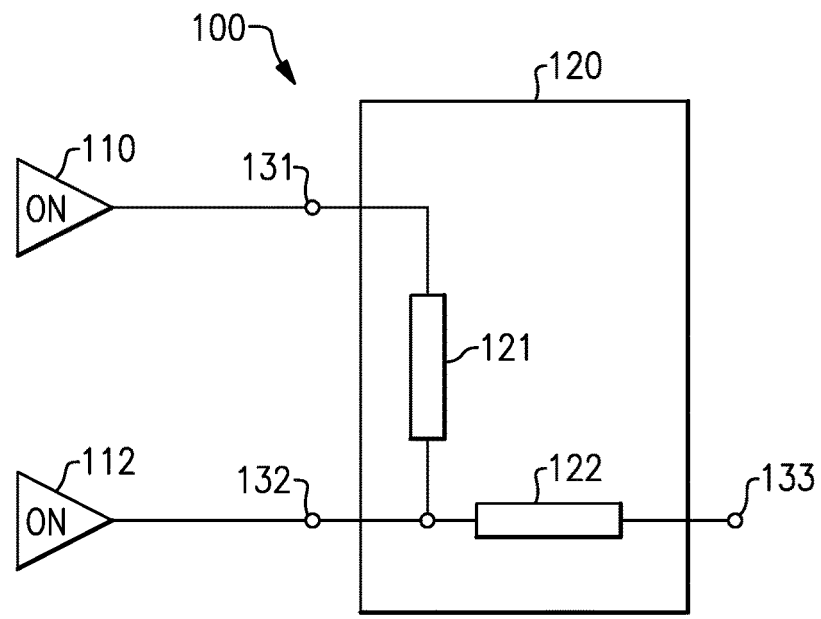
FIG. 1 shows an example combiner configuration in which both a carrier amplifier and a peaking amplifier are in an on state.

Disclosed are various examples related to combiners for Doherty power amplifier (PA) applications. A combiner can be implemented as part of a Doherty PA, and is typically utilized to provide a number of functions. For example, a combiner can be configured to provide equal power combining when the PA operates at full power. FIG. 1 shows an example of such a configuration where the combiner can act as a conventional power combiner. In FIG. 1, values of various performance and operating parameters are examples; and can be adjusted appropriately for different applications.

Thus, in FIG. 1, a configuration 100 is illustrated in which both a carrier amplifier 110 and a peaking amplifier 112 are in an on state. In some implementations, the both the carrier amplifier 110 and the peaking amplifier are saturated and have a power-added efficiency (PAE) of 50% or greater. The outputs of the carrier amplifier 110 and the peaking amplifier 112 are fed to respective input ports 131, 132 of a transmission line combiner 120. At both the first input port 131 and the second input port 132, an impedance of 50 Ohms may be presented. The transmission line combiner 120 includes a 50-Ohm transmission line 121 coupled between the first input port 131 and the second input port 132 and a 35.5-Ohm transmission line 122 coupled between the second input port 132 and an output port 133. The input of the 35.5-Ohm transmission line 122 may present an impedance of 25 Ohms.

Figure 2:
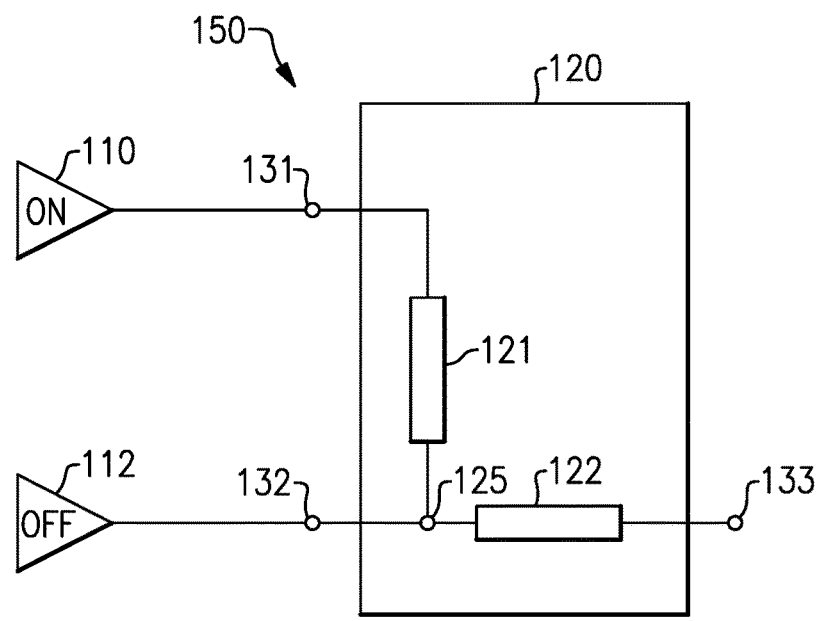
FIG. 2 shows an example combiner configuration in which a carrier amplifier is in an on state and a peaking amplifier is in an off state.

In another example, a combiner can be configured to provide impedance transformation between the PA and the load coupled to the PA. For example, a 2:1 impedance transformation can be implemented from the load to the output of the carrier amplifier when the peaking amplifier is idle. Such a transformation functionality is shown in FIG. 2. Again, values of various performance and operating parameters are examples; and can be adjusted appropriately for different applications. The foregoing functionality can be desirable over as broad as possible fractional bandwidth in order to achieve economical coverage of multiple operating frequencies with one amplifier.

Thus, in FIG. 2, a configuration 150 is illustrated in which the carrier amplifier 110 is in an on state and the peaking amplifier 112 is in an off state. In some implementations, the carrier amplifier 110 is saturated and has a PAE of 50% or greater. In such a configuration 150, an impedance of 100 Ohms may be presented at the first input port 131 and a very high impedance (a near open) may be presented at the second input port 132.

Figure 3:
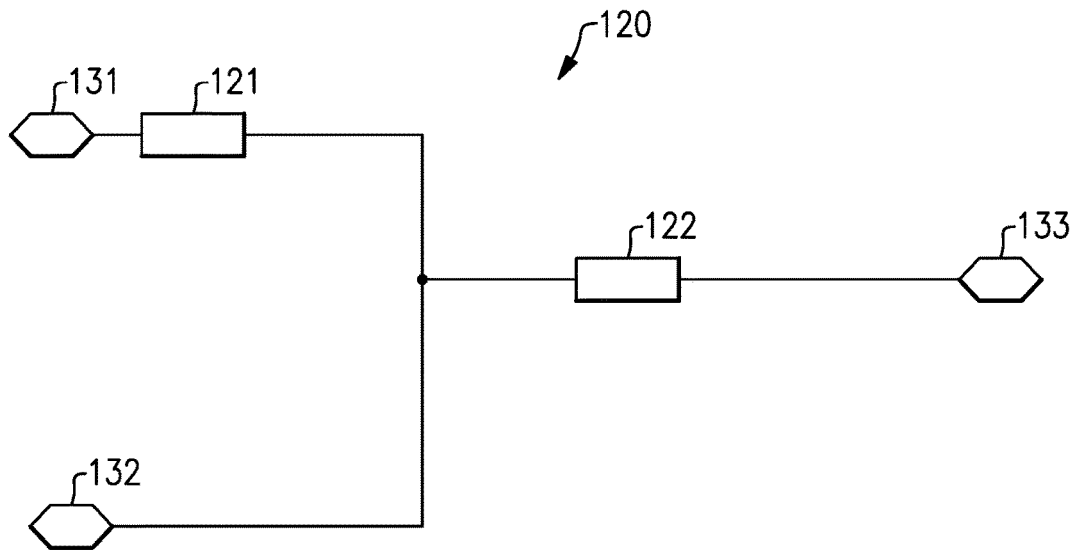
FIG. 3 shows an example Doherty combiner that includes two or more quarter wave transmission lines.
Figure 4:
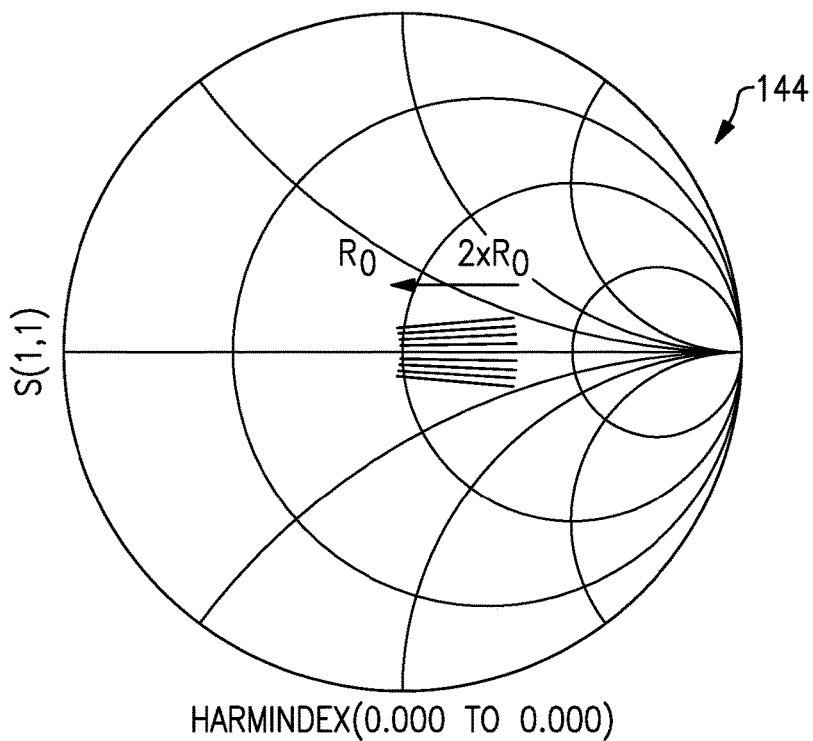
FIG. 4 shows an example Smith chart for the combiner of FIG. 3.

FIG. 3 shows an example of a common Doherty combiner 120 that includes two or more quarter wave transmission lines 121, 122 set up in such a way that both combining and impedance transformation functions are achieved. Such an implementation is typically relatively bulky, especially at low frequency. Accordingly, such a combiner 120 may not be particularly suitable for applications in devices such as RFIC (radio-frequency integrated circuit), MMIC (monolithic microwave integrated circuit), and other RF modules. Impedance spread vs. frequency for the Doherty combiner 120 of FIG. 3 is shown in an example Smith chart 144 of FIG. 4.

Other types of Doherty combiners can be based on lumped elements. Most of such implementations are limited to relatively narrow bands of operation.

Figure 5:
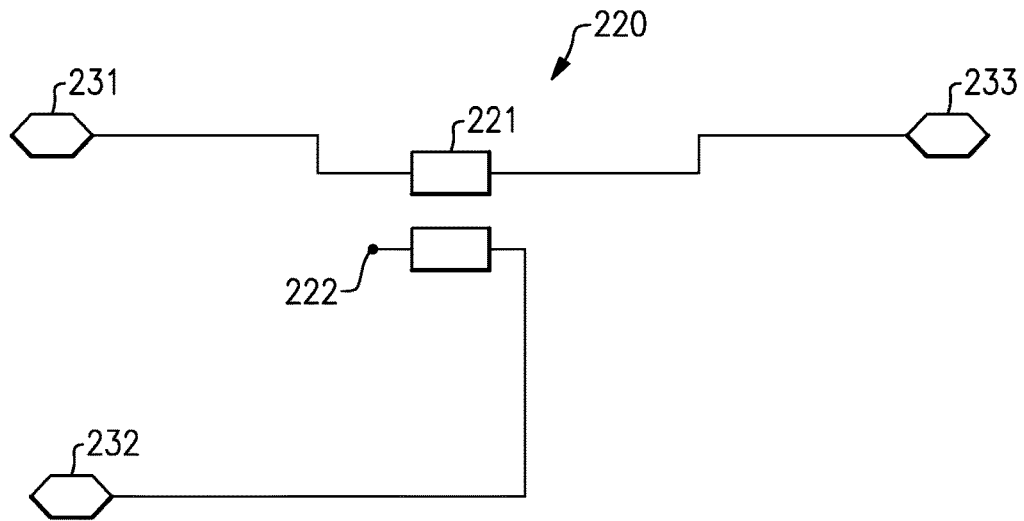
FIG. 5 shows an example Doherty combiner that includes a 3 dB coupler.
Figure 6:
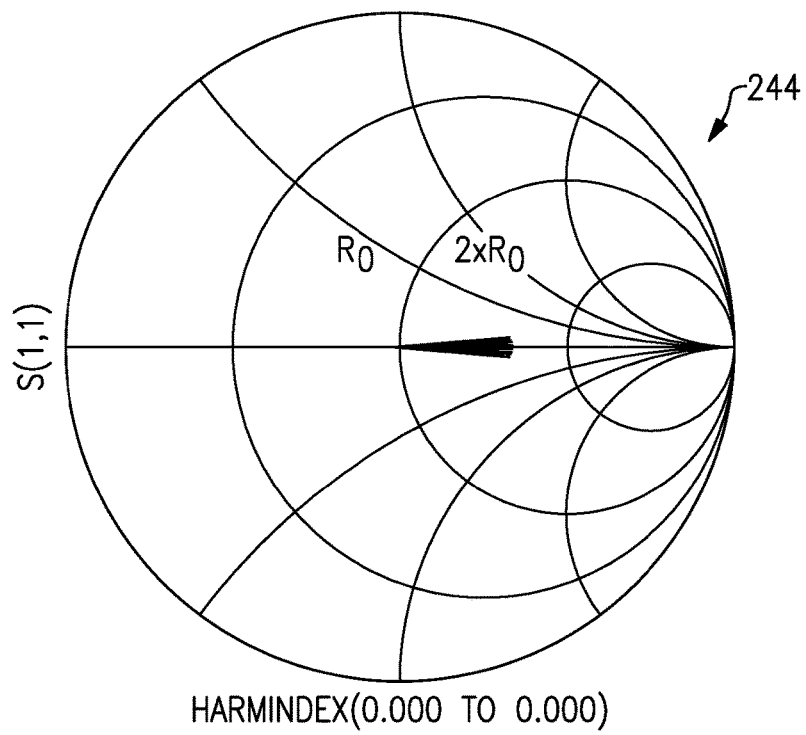
FIG. 6 shows an example Smith chart for the combiner of FIG. 5.

FIG. 5 shows another example of a Doherty combiner 220 that utilizes a 3 dB coupler 221 with near open termination impedance at an isolation port 222. Even though such an implementation is more compact than the example combiner 120 of FIG. 3, it is still typically too large for applications such as RFIC, MMIC and other RF modules, at low frequency due to its quarter wave length. The combiner 220 includes a 3 db coupler 221 having a first port coupled to a first input port 231 of the combiner 220, a second port coupled to a second input port 232 of the combiner 220, a third port coupled to an output port 233 of the combiner 220, and a fourth port (e.g., isolation port 222) coupled to a near open termination impedance. Impedance spread vs. frequency for the Doherty combiner 220 of FIG. 5 is shown in an example Smith chart 244 of FIG. 6.

Figure 7:
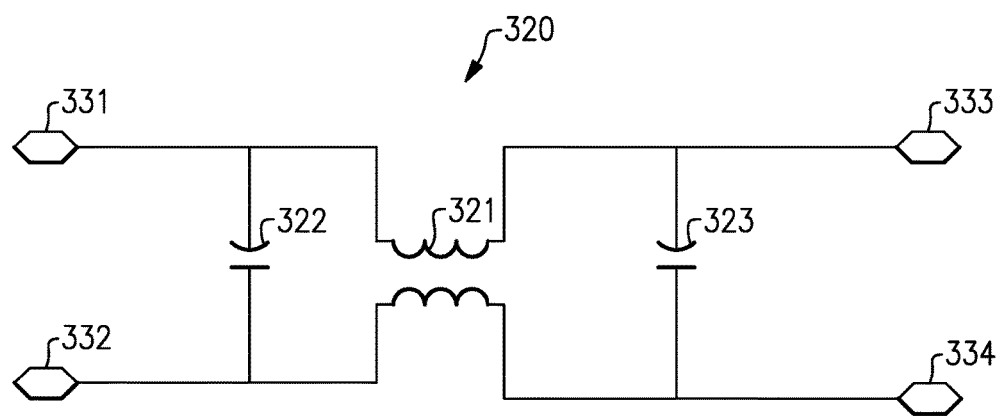
FIG. 7 shows an example hybrid circuit that can be utilized as a Doherty combiner.
Figure 8:
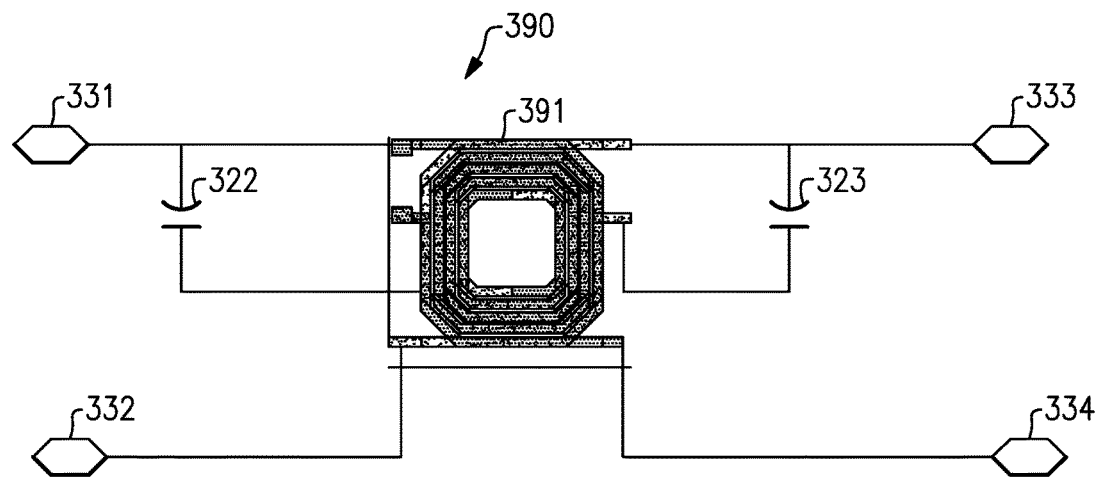
FIG. 8 shows another example hybrid circuit that can be utilized as a Doherty combiner.

FIGS. 7 and 8 show an example of a hybrid circuit that can be utilized as a Doherty combiner. Such a hybrid circuit can be configured to be particularly suitable for applications such as RFIC, MMIC and other RF modules. FIG. 7 shows a schematic representation of such a hybrid circuit, and FIG. 8 shows an example layout of the same.

The hybrid circuit of FIGS. 7 and 8 can be implemented as a semi-lumped 90 degree hybrid based on balun. Due to the compact nature of the balun used, such a design can be easily implemented on insulating/semi-insulating substrates such as silicon, GaAs and IPD (e.g., glass or silicon).

In the hybrid circuit of FIGS. 7 and 8, values of various performance and operating parameters are examples; and can be adjusted appropriately for different applications.

Thus, in FIG. 7, a signal combiner 320 is shown including a first port 331, a second port 332, a third port 333, and fourth port 334. A first capacitor 322 couples the first port 331 and the second port 332. A second capacitor 323 couples the third port 333 and the fourth port 334. The signal combiner 320 also includes a transformer 321 with four ports respectively coupled to the four ports 331-334 of the signal combiner 320. In FIG. 8, a substantially similar signal combiner 390 is illustrated including a balun transformer 391 including a first coil and a second coil.

FIG. 9 shows an example S-parameter (scattering parameter) matrix that can represent the example of FIG. 5, and FIG. 10 shows an example S-parameter matrix that can represent the example of FIGS. 7 and 8. One can see that the S-parameter matrix of FIG. 10 is significantly different from the S-parameter matrix of FIG. 9. In the example of FIG. 5, an open termination at the isolation port can result in Doherty action. In the example of FIGS. 7 and 8, a specific termination can be provided at the isolation port to achieve Doherty action. Examples of termination are described herein in greater detail.

In some embodiments, it can be shown that such a specific termination can be implemented as a capacitance (e.g., capacitor) whose reactance is equal in magnitude to characteristic impedance of the system. Accordingly, such a capacitance can be expressed as $C=1/(2\pi f Z_0)$, where f is the operating frequency of the Doherty PA and $Z_0$ is a characteristic impedance of a load coupled to the Doherty PA.

Figure 11:
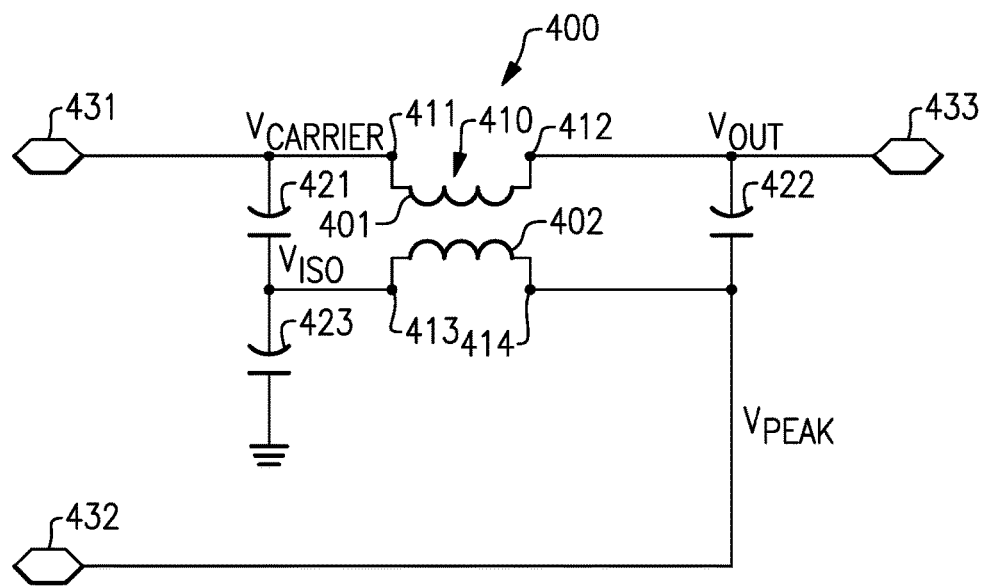
FIG. 11 shows an example Doherty combiner configuration that utilizes the hybrid circuit of FIG. 7.

FIG. 11 shows an example of a Doherty combiner configuration 400 that utilizes the hybrid circuit of FIGS. 7 and 8. The configuration 400 includes a first input port 431 which can be configured to receive a carrier-amplified signal of a Doherty PA, a second input port 432 which can be configured to receive a peaking-amplified signal of a Doherty PA, and an output port 433 which outputs a combination of the signals received at the first input port 431 and the second input port 432. The configuration 400 includes a transformer (e.g., a balun transformer) having a first coil 401 and a second coil 402, the first coil 401 implemented between a first port 411 and a second port 412, the second coil 402 implemented between a third port 413 and a fourth port 414. The first port 411 and the third port 413 are coupled by a first capacitor 421 and the second port 412 and the fourth port 414 are coupled by a second capacitor 422. The third port 413 is coupled to ground via a termination circuit which, in FIG. 11, includes a third capacitor 423. In some implementations, the capacitance of the first capacitor 421 and the second capacitor 422 are equal. In some implementations, the capacitance of the third capacitor 423 is twice the capacitance of the first capacitor 421 and/or the second capacitor 422.

Figure 12:
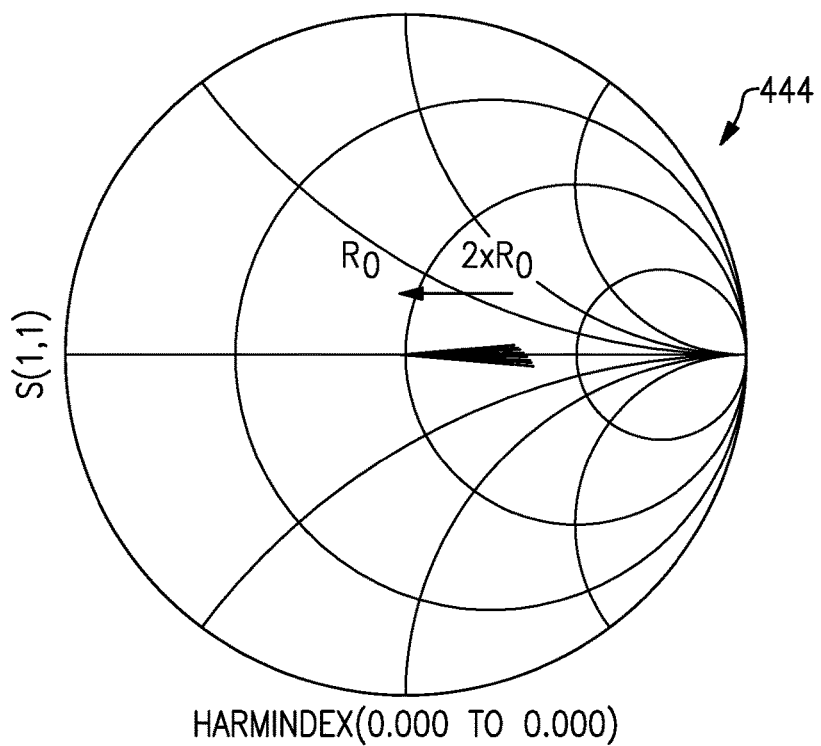
FIG. 12 shows impedance trajectories resulting from Doherty action in the combiner of FIG. 11.

Impedance trajectories 444 resulting from Doherty action in the combiner 400 of FIG. 11 are shown in FIG. 12. Spread of impedance trajectories is somewhat wider than that of the example of FIG. 6, but superior to the example of FIG. 4. In the Doherty combiner of FIG. 11, values of various performance and operating parameters are examples; and can be adjusted appropriately for different applications.

Figure 13:
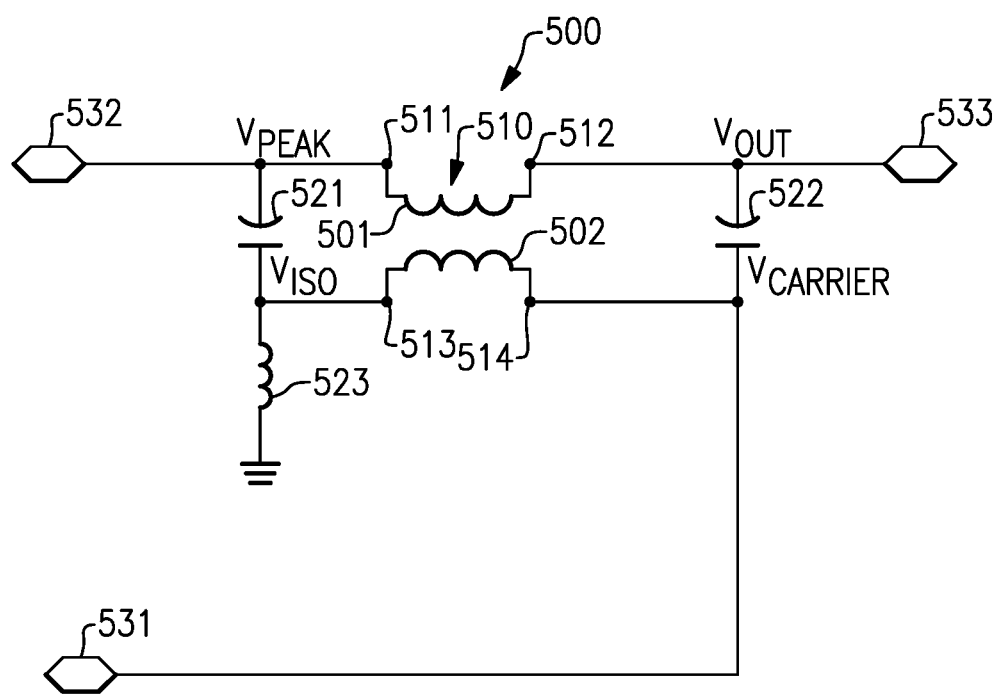
FIG. 13 shows another example Doherty combiner configuration that utilizes the hybrid circuit of FIG. 7.

It can be shown that an alternative configuration with an inductive termination of $L=Z_0/(2\pi f)$ can provide Doherty combiner functionality in a similar manner. Port positions of carrier and peaking amplifier can be swapped in this case. FIG. 13 shows an example where such an inductive termination is utilized.

The Doherty combiner configuration 500 of FIG. 13 includes a first input port 531 which can be configured to receive a carrier-amplified signal of a Doherty PA, a second input port 532 which can be configured to receive a peaking-amplified signal of a Doherty PA, and an output port 533 which outputs a combination of the signals received at the first input port 531 and the second input port 532. The configuration 500 includes a transformer (e.g., a balun transformer) having a first coil 501 and a second coil 502, the first coil 501 implemented between a first port 511 and a second port 512, the second coil 502 implemented between a third port 513 and a fourth port 514. The first port 511 and the third port 513 are coupled by a first capacitor 521 and the second port 512 and the fourth port 514 are coupled by a second capacitor 522. The third port 513 is coupled to ground via a termination circuit which, in FIG. 13, includes an inductor 523. In the Doherty combiner 500 of FIG. 13, values of various performance and operating parameters are examples; and can be adjusted appropriately for different applications.

In some embodiments, the examples described in reference to FIGS. 7, 8 and 11-13 can be especially useful for RFIC, MMIC and RF module (e.g., hybrid module) configurations where impedance matching is achieved by use of magnetic transformers or autotransformers. In some embodiments, a near-open output impedance of the peaking amplifier device is not inverted by the matching circuit and can be presented as such at the peaking amplifier port of a Doherty combiner.

Figure 14:
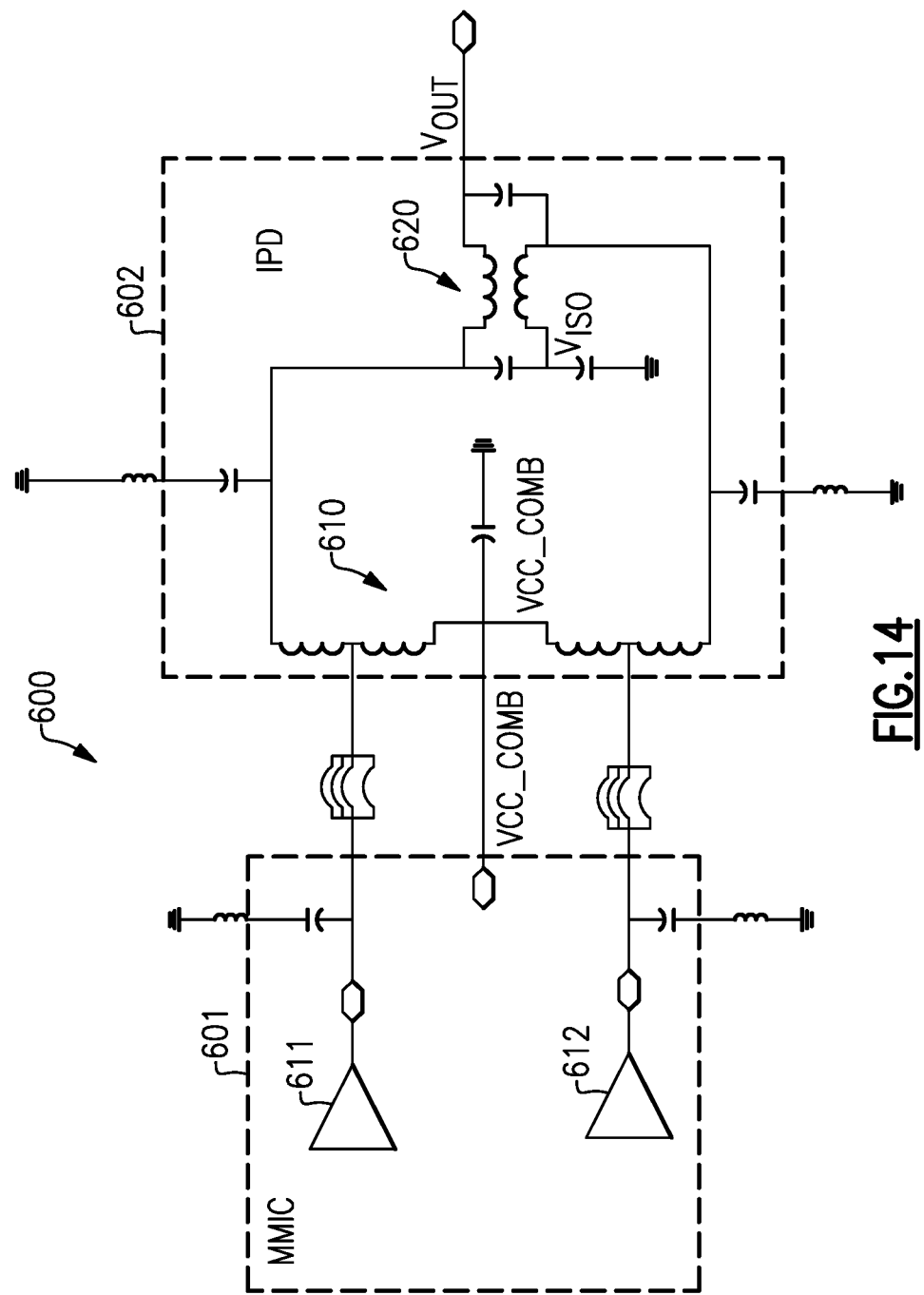
FIG. 14 shows an example of integration of a hybrid circuit and an auto-transformer based impedance matching as an integrated passive device (IPD).

FIG. 14 shows an example of integration of a hybrid circuit having one or more features as described herein and an auto-transformer based impedance matching as an integrated passive device (IPD). The circuit 600 includes an IPD 602 including an impedance matching network 610 including one or more auto-transformers. The IPD further includes a combiner 620, e.g., as described above. The circuit 600 further includes an MMIC 601 having a carrier amplifier 611 and a peaking amplifier 612.

If an impedance inverting matching circuit is used, such as Pi-network, T-network or a quarter wave transformer, the peaking amplifier typically presents a near short impedance at the input of Doherty combiner when it is idle. In such an example, an inverted load-modulation trajectory is typically required or desired from a Doherty combiner (e.g., from 0.5*Rload impedance to Rload impedance as shown in the example Smith chart 744 of FIG. 15). In some embodiments, such functionality can be achieved by swapping carrier and peaking amplifier inputs. FIG. 16 shows an example of such a swapped configuration. Thus, in FIG. 16, the circuit 700 includes an IPD 702 including a combiner 720, e.g., as described above. The circuit 700 further includes an MMIC 701 having a carrier amplifier 711 and a peaking amplifier 712. The circuit further includes an impedance inverting matching circuit 710. Although not illustrated in FIG. 16, the impedance inverting matching circuit 710 may be implemented within the IPD 702.

Figure 15:
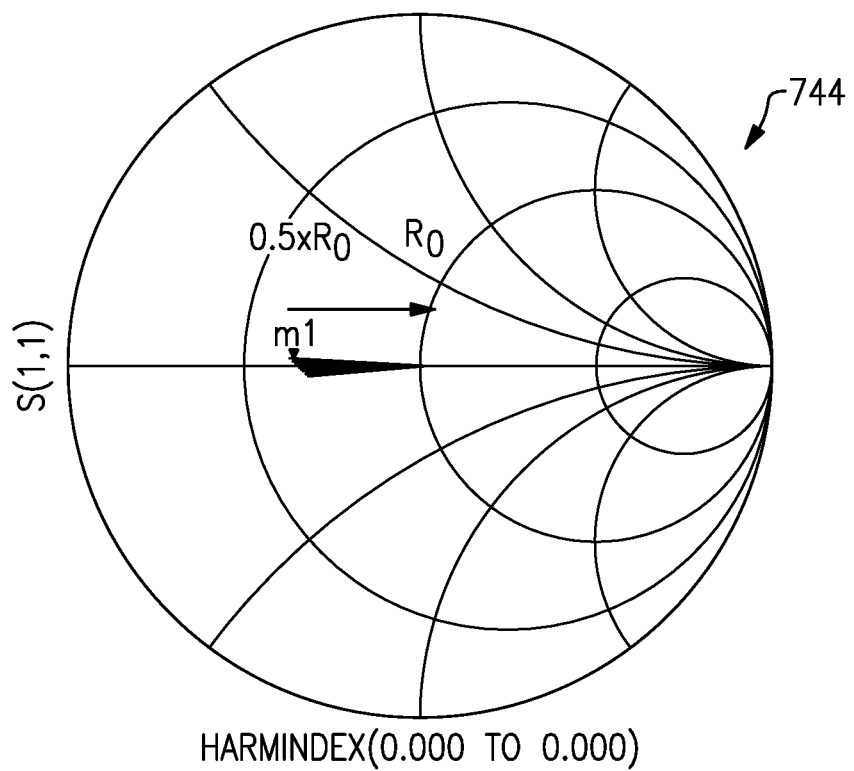
FIG. 15 shows an example Smith chart with an inverted load-modulation trajectory.
Figure 16:
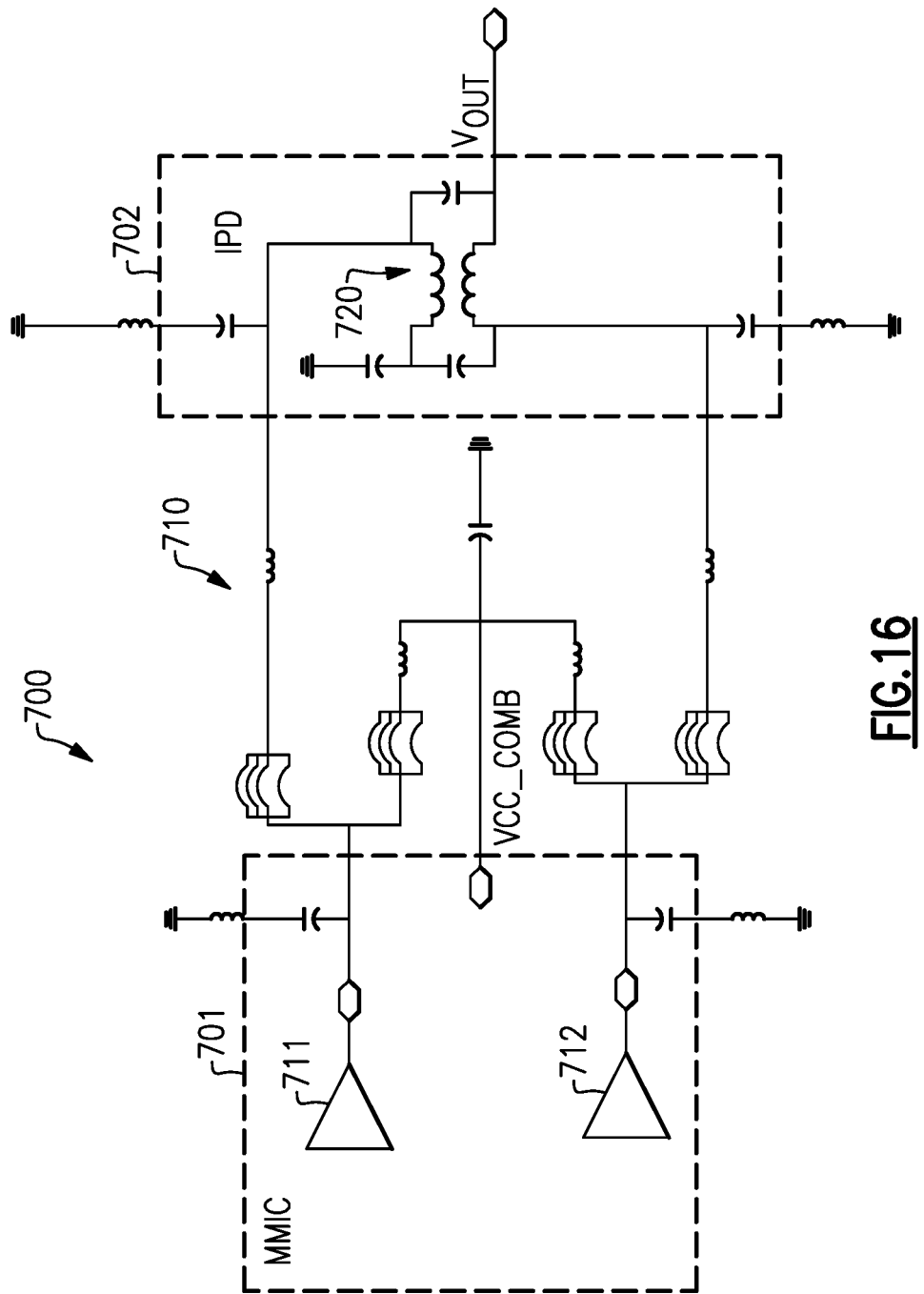
FIG. 16 shows another example of integration of a hybrid circuit as an IPD.

In FIGS. 14-16, values of various performance and operating parameters are examples; and can be adjusted appropriately for different applications.

Figure 17:
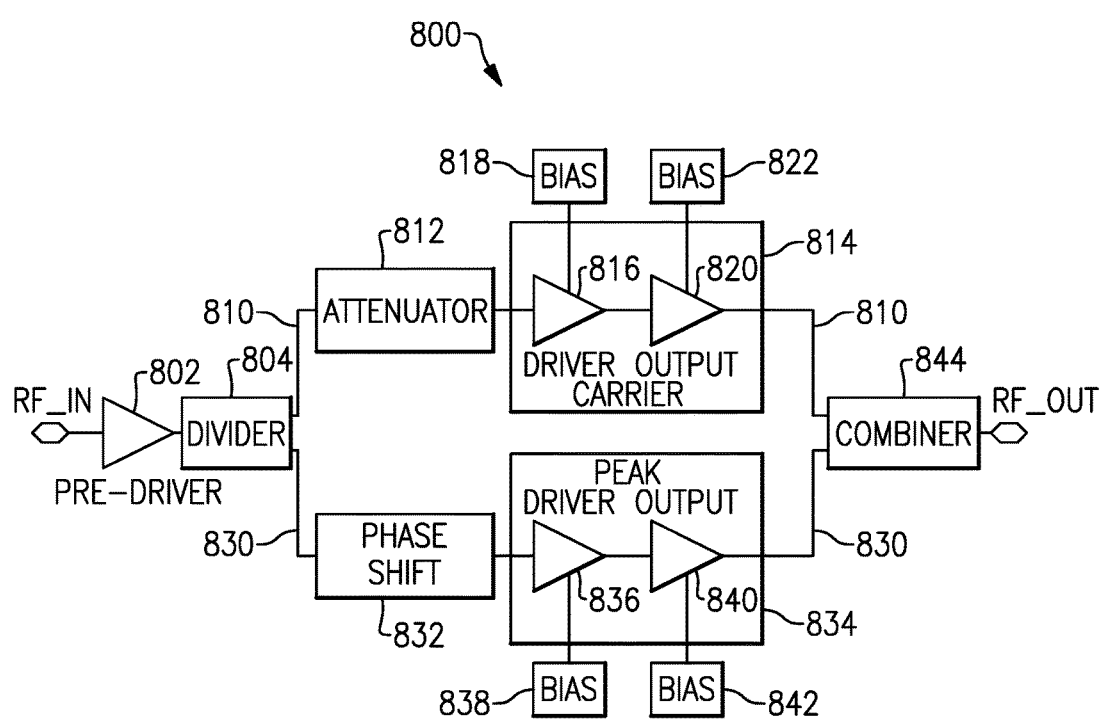
FIG. 17 shows an example architecture of a power amplifier in which a Doherty combiner having one or more features as described herein can be implemented.

FIG. 17 shows an example architecture of a PA 800 in which a Doherty combiner having one or more features as described herein can be implemented. The architecture shown is a Doherty PA architecture. Although the various examples are described in the context of such a Doherty PA architecture, it will be understood that one or more features of the present disclosure can also be implemented in other types of PA systems.

The example PA 800 is shown to include an input port (RF_IN) for receiving an RF signal to be amplified. Such an input RF signal can be partially amplified by a pre-driver amplifier 802 before being divided into a carrier amplification path 810 and a peaking amplification path 830. Such a division can be achieved by a divider 804. Examples related to the divider 804 (also referred to herein as a splitter or a power splitter) are described herein in greater detail.

In FIG. 17, the carrier amplification path 810 is shown to include an attenuator 812 and amplification stages collectively indicated as 814. The amplification stages 814 are shown to include a driver stage 816 and an output stage 820. The driver stage 816 is shown to be biased by a bias circuit 818, and the output stage 820 is shown to be biased by a bias circuit 822. In some embodiments, there may be more or less number of amplification stages. In various examples described herein, the amplification stages 814 are sometimes described as an amplifier; however, it will be understood that such an amplifier can include one or more stages.

In FIG. 17, the peaking amplification path 830 is shown to include phase shifting circuit 832 and amplification stages collectively indicated as 834. The amplification stages 834 are shown to include a driver stage 836 and an output stage 840. The driver stage 836 is shown to be biased by a bias circuit 838, and the output stage 840 is shown to be biased by a bias circuit 842. In some embodiments, there may be more or less number of amplification stages. In various examples described herein, the amplification stages 834 are sometimes described as an amplifier; however, it will be understood that such an amplifier can include one or more stages.

FIG. 17 further shows that the carrier amplification path 810 and the peaking amplification path 830 can be combined by a combiner 844 so as to yield an amplified RF signal at an output port (RF_OUT). Examples related to the combiner 844 are described herein in greater detail. For example, the combiner 844 may be implemented as one of the combiners of FIGS. 11 and 13.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 18:
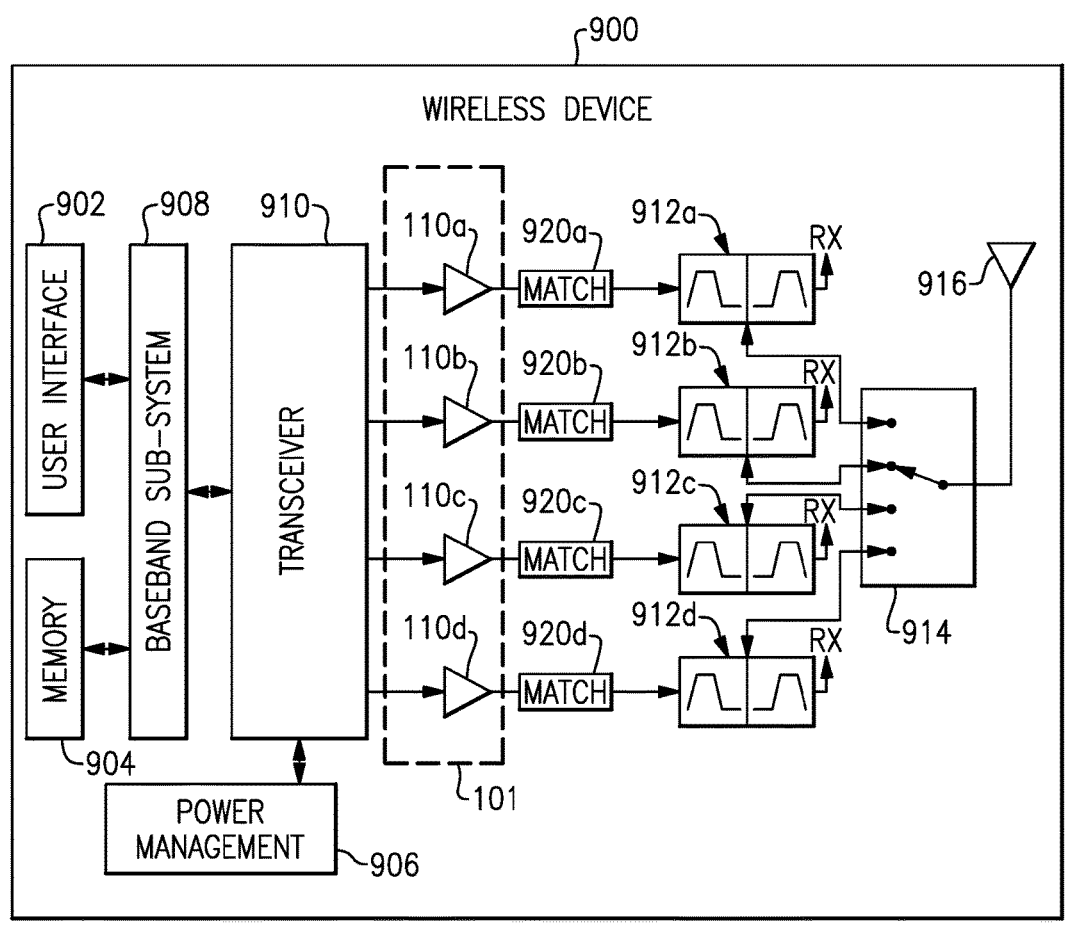
FIG. 18 depicts a wireless device having one or more features described herein.

FIG. 18 schematically depicts an example wireless device 900 having one or more advantageous features described herein. In the example, one or more PAs 910 collectively indicated as a PA architecture 101 can include one or more features as described herein. Such PAs can facilitate, for example, multi-band operation of the wireless device 900.

The PAs 110a-110d can receive their respective RF signals from a transceiver 910 that can be configured and operated to generate RF signals to be amplified and transmitted, and to process received signals. The transceiver 910 is shown to interact with a baseband sub-system 908 that is configured to provide conversion between data and/or voice signals suitable for a user and RF signals suitable for the transceiver 910. The transceiver 910 is also shown to be connected to a power management component 906 that is configured to manage power for the operation of the wireless device 900. Such power management can also control operations of the baseband sub-system 908 and the PAs 110a-110d.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device 900, and/or to provide storage of information for the user.

In the example wireless device 900, outputs of the PAs 110a-110d are shown to be matched (via match circuits 920a-920d) and routed to an antenna 916 via their respective duplexers 912a-912d and a band-selection switch 914. The band-selection switch 914 can be configured to allow selection of an operating band. In some embodiments, each duplexer 912 can allow transmit and receive operations to be performed simultaneously using a common antenna (e.g., 916). In FIG. 18, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An amplifier architecture comprising:
an input circuit configured to receive a signal and split the signal into a first portion and a second portion;
an amplification circuit having a carrier amplifier coupled to the input circuit to receive the first portion and a peaking amplifier coupled to the input circuit to receive the second portion, the carrier amplifier biased different than the peaking amplifier; and
an output circuit coupled to the amplification circuit and including a balun transformer circuit having a first coil and a second coil, the first coil implemented between a first port and a second port, the second coil implemented between a third port and a fourth port, the first port and the third port coupled by a first capacitance, the second port and the fourth port coupled by a second capacitance, the first port configured to receive a first signal from the carrier amplifier, the fourth port configured to receive a second signal from the peaking amplifier, the second port configured to provide a combination of the first signal and the second signal as an amplified signal, the output circuit further including a termination circuit that couples the third port to a ground.

2. The amplifier architecture of claim 1 wherein the amplification circuit is a power amplifier circuit.

3. The amplifier architecture of claim 2 wherein the termination circuit is configured to provide a reactance approximately equal in magnitude as an impedance at the second port.

4. The amplifier architecture of claim 3 wherein the termination circuit includes a capacitance such that the termination circuit has a capacitive reactance approximately equal in magnitude as the impedance at the second port.

5. The amplifier architecture of claim 3 wherein the termination circuit includes an inductance such that the termination circuit has an inductive reactance approximately equal in magnitude as the impedance at the second port.

6. The amplifier architecture of claim 1 wherein the signal includes a radio-frequency signal.

7. A method for amplifying a signal, the method comprising:
receiving the signal;
splitting the signal into a first portion and a second portion;
routing the first portion to a carrier amplifier and the second portion to a peaking amplifier;
biasing the carrier amplifier;
biasing the peaking amplifier different than the carrier amplifier; and
combining a first signal from the carrier amplifier and a second signal from the peaking amplifier with an output circuit including a balun transformer circuit having a first coil and a second coil, the first coil implemented between a first port and a second port, the second coil implemented between a third port and a fourth port, the first port and the third port coupled by a first capacitance, the second port and the fourth port coupled by a second capacitance, the first port configured to receive the first signal from the carrier amplifier, the fourth port configured to receive the second signal from the peaking amplifier, the second port configured to provide a combination of the first signal and the second signal as an amplified signal, the output circuit further including a termination circuit that couples the third port to a ground.

8. The method of claim 7 wherein the combining is performed such that a reactance provided by the termination circuit is approximately equal in magnitude as an impedance at the second port.

9. The method of claim 8 wherein the termination circuit includes a capacitance such that the termination circuit has a capacitive reactance approximately equal in magnitude as the impedance at the second port.

10. The method of claim 8 wherein the termination circuit includes an inductance such that the termination circuit has an inductive reactance approximately equal in magnitude as the impedance at the second port.

11. An integrated passive device comprising:
a substrate;
first, second, third and fourth ports implemented on the substrate; and
a signal combiner circuit implemented on the substrate and including a balun transformer circuit having a first coil and a second coil, the first coil implemented between the first and second ports, the second coil implemented between the third and fourth ports, the first and third ports coupled by a first capacitance, the second and fourth ports coupled by a second capacitance, the first port configured to receive a first signal from one of a carrier amplifier and a peaking amplifier, the fourth port configured to receive a second signal from the other of the carrier amplifier and the peaking amplifier, the carrier amplifier biased different than the peaking amplifier, the second port configured to provide a combination of the first signal and the second signal as an amplified signal, the signal combiner circuit further including a termination circuit that couples the third port to a ground.

12. The integrated passive device of claim 11 wherein the substrate includes silicon or glass.

13. The integrated passive device of claim 11 further comprising an auto-transformer based impedance matching circuit.

14. The integrated passive device of claim 11 wherein the termination circuit is configured to include a reactance value approximately equal in magnitude as an impedance at the second port.

* * * * *